United States Patent
Okunishi

(10) Patent No.: US 11,699,576 B2
(45) Date of Patent: Jul. 11, 2023

(54) FILTER DEVICE AND PLASMA PROCESSING APPARATUS

(71) Applicant: TOKYO ELECTRON LIMITED, Tokyo (JP)

(72) Inventor: Naohiko Okunishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 871 days.

(21) Appl. No.: 16/407,876

(22) Filed: May 9, 2019

(65) Prior Publication Data

US 2019/0348263 A1 Nov. 14, 2019

(30) Foreign Application Priority Data

May 10, 2018 (JP) .................. 2018-091444

(51) Int. Cl.
| | |
|---|---|
| *H01J 37/32* | (2006.01) |
| *C23C 16/458* | (2006.01) |
| *C23C 16/455* | (2006.01) |
| *H01L 21/683* | (2006.01) |

(52) U.S. Cl.
CPC .... *H01J 37/32724* (2013.01); *C23C 16/4586* (2013.01); *C23C 16/45544* (2013.01); *C23C 16/45565* (2013.01); *H01J 37/32091* (2013.01); *H01J 37/32183* (2013.01); *H01J 37/32577* (2013.01); *H01J 37/32642* (2013.01); *H01J 37/32697* (2013.01); *H01L 21/6831* (2013.01)

(58) Field of Classification Search
CPC ... H01J 37/32082–321; H01J 37/32174; H01J 37/32183; H01J 37/32522; H01J 37/32577; H01J 37/32715; H01J 37/32724; H01J 37/32697; H01J 37/32192; H01J 37/32091; H01J 37/32642; C23C 16/4586; C23C 16/45544; C23C 16/45565; H01L 21/6831; H01L 21/6833
See application file for complete search history.

(56) References Cited

U.S. PATENT DOCUMENTS

| | | | | |
|---|---|---|---|---|
| 7,718,930 | B2 * | 5/2010 | Kawasaki | ......... H01L 21/67103 219/390 |
| 7,938,694 | B2 * | 5/2011 | Hiramitsu | ............. H01R 13/11 439/854 |
| 8,398,815 | B2 * | 3/2013 | Yamazawa | ............... H05H 1/46 156/345.52 |
| 2005/0241769 | A1 * | 11/2005 | Satoyoshi | ......... H01J 37/32082 156/345.44 |

(Continued)

FOREIGN PATENT DOCUMENTS

| | | |
|---|---|---|
| JP | 2000-058296 A | 2/2000 |
| JP | 2009-123505 A | 6/2009 |
| JP | 2014-099585 A | 5/2014 |

*Primary Examiner* — Benjamin Kendall
*Assistant Examiner* — Kurt Sweely
(74) *Attorney, Agent, or Firm* — Weihrouch IP

(57) ABSTRACT

There is provided a filter device. In the filter device, a plurality of coils are arranged coaxially. Each of a plurality of wirings is electrically connected to one end of each of the coils. Each of a plurality of capacitors is connected between the other end of each of the coils and the ground. A housing is electrically grounded and configured to accommodate therein the coils. Further, each of the wirings at least partially extends into the housing and has a length that is adjustable in the housing.

8 Claims, 14 Drawing Sheets

(56) References Cited

U.S. PATENT DOCUMENTS

2010/0157552 A1* 6/2010 Thom ............... H03H 1/00
                                                336/200
2014/0110061 A1* 4/2014 Okunishi .......... H01J 37/32091
                                                156/345.52

* cited by examiner

_US 11,699,576 B2_

FILTER DEVICE AND PLASMA PROCESSING APPARATUS

CROSS-REFERENCE TO RELATED APPLICATIONS

This application claims priority to Japanese Patent Application No. 2018-091444 filed on May 10, 2018, the entire contents of which are incorporated herein by reference.

TECHNICAL FIELD

The present disclosure relates to a filter device and a plasma processing apparatus.

BACKGROUND

In manufacturing electronic devices, a plasma processing apparatus has been widely used. The plasma processing apparatus includes a chamber, a supporting table, and a high frequency power source. The supporting table is provided in an inner space of the chamber and is configured to support a substrate to be mounted thereon. The supporting table includes a lower electrode and an electrostatic chuck. The high frequency power source is connected to the lower electrode.

In plasma processes performed by the plasma processing apparatus, it is required to control in-plane temperature distribution of the substrate. In order to control the in-plane temperature distribution of the substrate, a plurality of heaters is provided in the electrostatic chuck. Each of the heaters is connected to a heater controller through a plurality of power supply lines.

A high frequency power is supplied from the high frequency power source to the lower electrode of the supporting table. The high frequency power supplied to the lower electrode may flow into the power supply lines. Thus, a plurality of filters is provided in the power supply lines in order to cut off or attenuate the high frequency power flowing into the power supply lines. Each of the filters includes a coil and a capacitor as described in Japanese Patent Application Publication No. 2014-99585. The filters are provided outside the chamber.

In the plasma processing apparatus, a plurality of high frequency powers having different frequencies may be supplied to the lower electrode. When the plurality of high frequency powers are used, the filter device needs to cut off or attenuate each of the high frequency powers. Therefore, the filter device is required to be able to control an impedance of a high frequency power having a higher frequency among the plurality of high frequency powers. In other words, the filter device needs to be able to control an impedance at a desired frequency.

SUMMARY

In accordance with an embodiment of the present disclosure, there is provided a filter device including: a plurality of coils arranged coaxially; a plurality of wirings, each of which is electrically connected to one end of each of the coils; a plurality of capacitors, each of which is connected between the other end of each of the coils and the ground; and a housing electrically grounded and configured to accommodate therein the coils. Further, each of the wirings at least partially extends into the housing and has a length that is adjustable in the housing.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
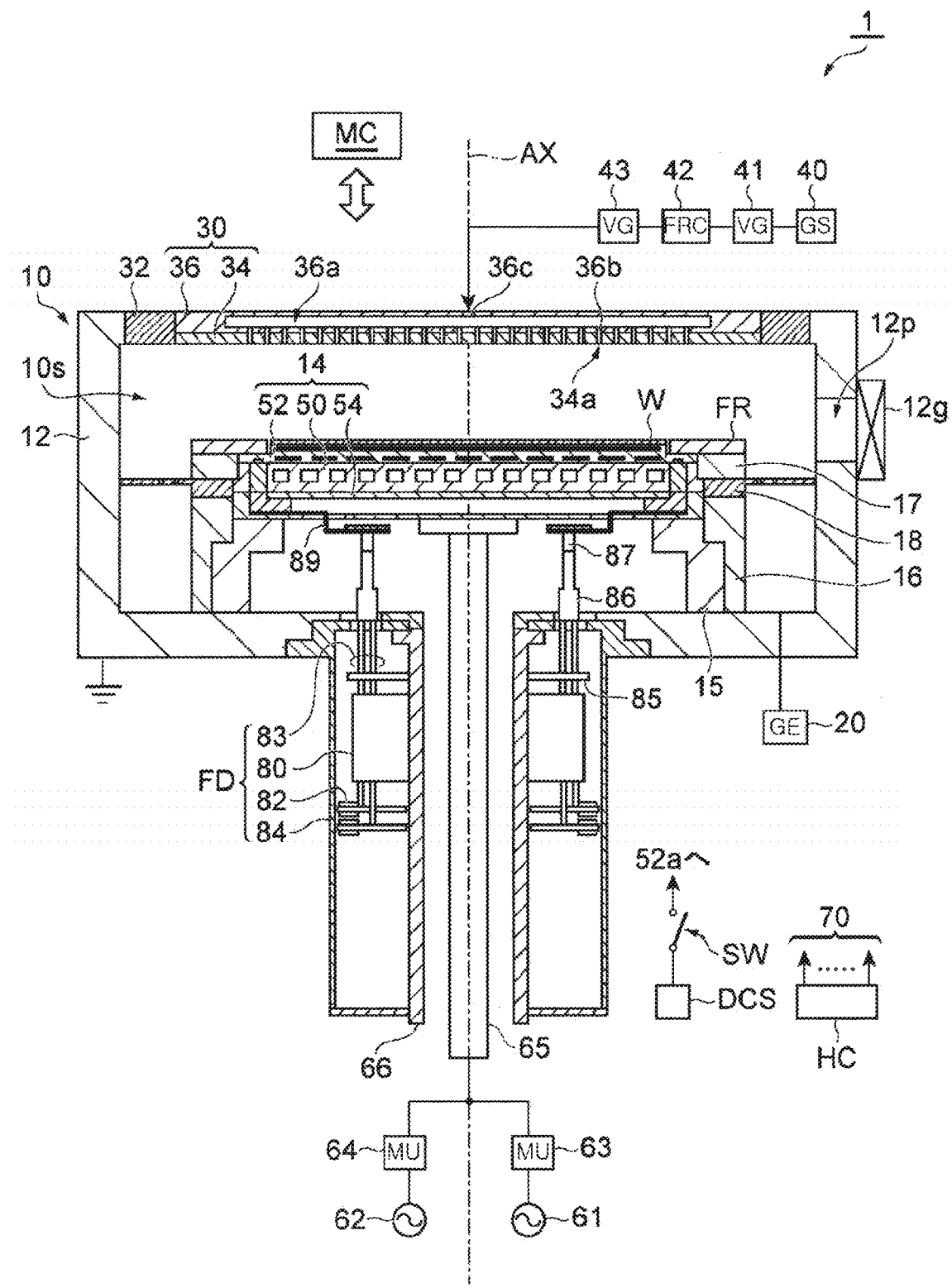
FIG. 1 schematically shows a plasma processing apparatus according to an embodiment.

Hereinafter, embodiments will be described in detail with reference to the accompanying drawings. Like reference numerals will be given to like or corresponding parts throughout the drawings.

FIG. 1 schematically shows a plasma processing apparatus according to an embodiment. FIG. 1 shows a cross-sectional view of the plasma processing apparatus according to an embodiment. The plasma processing apparatus 1 shown in FIG. 1 is a capacitively coupled plasma processing apparatus.

The plasma processing apparatus 1 includes a chamber 10. The chamber 10 has an inner space 10s. The chamber 10 includes a chamber body 12. The chamber body 12 has a substantially cylindrical shape. The inner space 10s is provided in the chamber body 12. The chamber body 12 is made of, e.g., aluminum. The chamber body 12 is frame-grounded. A plasma resistant film is formed on an inner wall surface of the chamber body 12. The inner wall surface of the chamber body 12 defines the inner space 10s. The plasma resistant film may be a film formed by anodic oxidation treatment or a ceramic film made of, e.g., yttrium oxide.

An opening 12p is formed at a sidewall of the chamber body 12. A substrate W is transferred between the inner space 10s and the outside of the chamber 10 through the opening 12p. The opening 12p can be opened and closed by a gate opening 12p. The gate valve 12g is provided along the sidewall of the chamber body 12. The substrate W is a disc-shaped plate made of, e.g., silicon.

The plasma processing apparatus 1 further includes a supporting table 14. The supporting table 14 is provided in the inner space 10s. The substrate W is mounted on the supporting table 14. The supporting table 14 is configured to support the substrate W in the inner space 10s. The supporting table 14 is mounted on and supported by a supporting part 15. The supporting part 15 extends upward from the bottom portion of the chamber body 12.

A member 16, a member 17, and a baffle plate 18 are provided around the supporting table 14 and the supporting part 15. The member 16 has a cylindrical shape and is made of a conductor. The member 16 extends upward from the bottom portion of the chamber body 12 along an outer peripheral surface of the supporting part 15. The member 17 has a substantially annular plate shape and is made of an insulator such as quartz. The member 17 is provided above the member 16. A focus ring FR is provided on the member 17 to surround a peripheral edge of the substrate W mounted on the supporting table 14.

The baffle plate 18 has a substantially annular plate shape. The baffle plate 18 is formed by coating ceramic such as yttrium oxide on an aluminum base material, for example. A plurality of through-holes is formed in the baffle plate 18. An inner peripheral portion of the baffle plate 18 is arranged between the member 16 and the member 17. The baffle plate 18 extends from the inner peripheral portion thereof to the sidewall of the chamber body 12. Below the baffle plate 18, a gas exhaust (GE) unit 20 is connected to the bottom portion of the chamber body 12. The gas exhaust unit 20 includes a pressure controller such as an automatic pressure control valve, and a vacuum pump such as a turbo molecular pump. The gas exhaust unit 20 is configured to decrease a pressure to the inner space 10s.

The plasma processing apparatus 1 further includes an upper electrode 30. The upper electrode 30 is provided above the supporting table 14. The upper electrode 30 blocks an upper opening of the chamber body 12 in cooperation with a member 32. The member 32 has an insulating property. The upper electrode 30 is held at an upper portion of the chamber body 12 through the member 32. The potential of the upper electrode 30 is set to the ground potential when a first high frequency power source to be described later is electrically connected to a lower electrode of the supporting table 14.

The upper electrode 30 includes a ceiling plate 34 and a holder 36. A bottom surface of the ceiling plate 34 faces the inner space 10s. The ceiling plate 34 is provided with a plurality of gas injection holes 34a. The gas injection holes 34a penetrate through the ceiling plate 34 in a plate thickness direction (vertical direction). The ceiling plate 34 is made of, e.g., silicon, but is not limited thereto. Alternatively, the ceiling plate 34 may be obtained by forming a plasma resistant film on a surface of an aluminum base material. The plasma resistant film may be a film formed by anodic oxidation treatment or a ceramic film made of, e.g., yttrium oxide.

The holder 36 is configured to detachably hold the ceiling plate 34. The holder 36 may be made of a conductive material such as aluminum. A gas diffusion space 36a is formed in the holder 36. A plurality of gas holes 36b extends downward from the gas diffusion space 36a. The gas holes 36b communicate with the respective gas injection holes 34a. A gas inlet port 36c is formed at the holder 36. The gas inlet port 36c is connected to the gas diffusion space 36a. Further, the gas inlet port 36c is connected to a gas source group (GS) 40 through a valve group (VG) 41, a flow rate controller (FRC) group 42, and a valve group (VG) 43.

The gas source group 40 includes a plurality of gas sources. Each of the valve group 41 and the valve group 43 includes a plurality of valves. The flow rate controller group 42 includes a plurality of flow rate controllers. Each of the flow rate controllers of the flow rate controller group 42 is a mass flow controller or a pressure control type flow controller. The gas sources of the gas source group 40 are connected to the gas inlet port 36c through the valves of the valve group 41 and the valve group 43, and the flow rate controllers of the flow rate controller group 42, respectively. The plasma processing apparatus 1 is configured to supply gases from one or more gas sources selected among the plurality of gas sources of the gas source group 40 to the inner space 10s at individually controlled flow rates.

The plasma processing apparatus 1 further includes a control unit MC. The control unit MC is a computer including a processor, a storage device, an input device, a display device and the like, and controls the respective components of the plasma processing apparatus 1. A control program and recipe data are stored in the storage device of the control unit MC. The control unit MC executes the control program and controls the respective components of the plasma processing apparatus 1 based on the recipe data. In the plasma processing apparatus 1, a process specified by the recipe data is performed under the control of the control unit MC.

Figure 2:
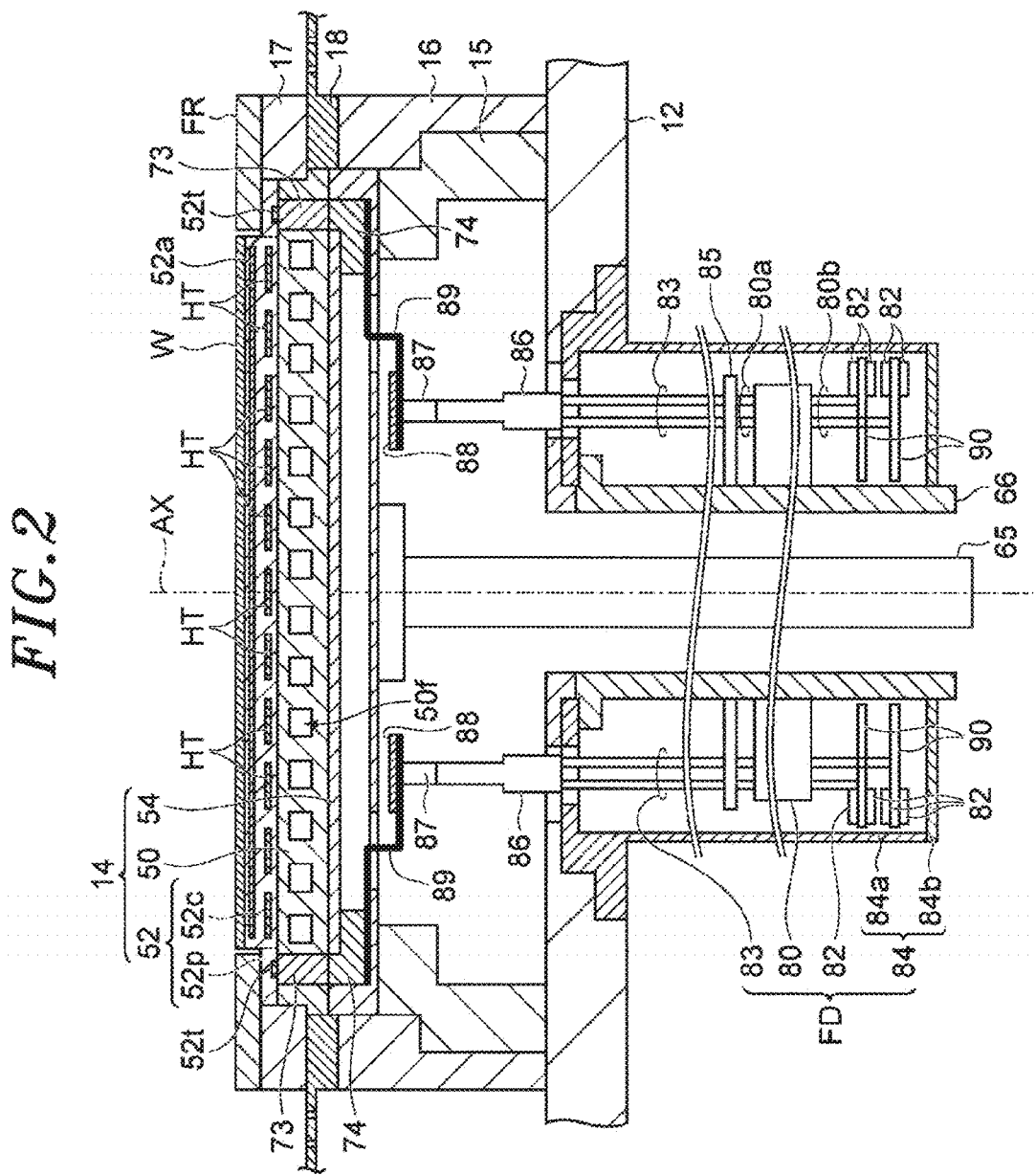
FIG. 2 is an enlarged cross-sectional view of a supporting table of the plasma processing apparatus shown in FIG. 1.

Hereinafter, the supporting table 14 and the components of the supporting table 14 of the plasma processing apparatus 1 will be described in detail with reference to FIGS. 1 and 2. FIG. 2 is an enlarged cross-sectional view of the supporting table of the plasma processing apparatus shown in FIG. 1. As shown in FIGS. 1 and 2, the supporting table 14 includes a lower electrode 50 and an electrostatic chuck 52. In one embodiment, the supporting table 14 further includes a conductive member 54.

The lower electrode 50 has a substantially disc shape and is made of a conductor such as aluminum. A flow path 50f is formed in the lower electrode 50. A heat exchange medium (e.g., a coolant) is supplied to the flow path 50f from a chiller unit provided outside the chamber 10. The heat exchange medium supplied to the flow path 50f is returned to the chiller unit. The lower electrode 50 is provided on the conductive member 54.

The conductive member 54 is made of a conductor, e.g., aluminum. The conductive member 54 is electrically connected to the lower electrode 50. The conductive member 54 is formed in a substantially annular plate shape and has a hollow inner space. The conductive member 54, the lower electrode 50, and the electrostatic chuck 52 have a common central axis (hereinafter, referred to as "axis AX"). The axis AX is also the central axis of the chamber 10.

As shown in FIG. 1, in one embodiment, the plasma processing apparatus 1 further includes a first high frequency power source 61 and a second high frequency power source 62. The first high frequency power source 61 and the second high frequency power source 62 are provided outside the chamber 10. The first high frequency power source 61 and the second high frequency power source 62 are electrically connected to the lower electrode 50 through a power feeding unit 65. The power feeding unit 65 has a columnar shape or a cylindrical shape. The power feeding unit 65 extends downward from the bottom portion of the lower electrode 50. In one embodiment, one end of the power feeding unit 65 is connected to the conductive member 54 and is electrically connected to the lower electrode 50 through the conductive member 54.

The first high frequency power source 61 mainly generates a first high frequency power that contributes to plasma generation. The frequency of the first high frequency power is, e.g., 40.68 MHz or 100 MHz. The first high frequency power source 61 is electrically connected to the lower electrode 50 through a matching unit (MU) 63 and the power feeding unit 65. The matching unit 63 has a circuit configured to match an output impedance of the first high frequency power source 61 and an impedance of a load side. The first high frequency power source 61 may be connected to the upper electrode 30 through the matching unit 63.

The second high frequency power source 62 mainly outputs a second high frequency power that contributes to attraction of ions to the substrate W. The frequency of the second high frequency power is, e.g., 13.56 MHz, that is lower than the frequency of the first high frequency power. The second high frequency power source 62 is electrically connected to the lower electrode 50 through a matching unit (MU) 64 and the power feeding unit 65. The matching unit 64 has a circuit configured to match an output impedance of the second high frequency power source 62 and the impedance of the load side.

The plasma processing apparatus 1 further includes a conductor pipe 66. The conductor pipe 66 is made of a conductor such as aluminum and has a substantially cylindrical shape. The conductor pipe 66 extends to surround the power feeding unit 65 outside the chamber 10. The conductor pipe 66 is connected to the bottom portion of the chamber body 12. The conductor pipe 66 is electrically connected to the chamber body 12. Therefore, the conductor pipe 66 is grounded. The power feeding unit 65 and the conductor pipe 66 have the axis AX as the central axis thereof.

As shown in FIGS. 1 and 2, the electrostatic chuck 52 is provided on the lower electrode 50. The electrostatic chuck 52 is configured to hold the substrate W mounted thereon. The electrostatic chuck 52 has a substantially disc shape and has a layer made of an insulator such as ceramics. The electrostatic chuck 52 further has an electrode 52*a* as an inner layer of the insulator layer. A power supply DCS is connected to the electrode 52*a* through a switch SW (see FIG. 1). When a voltage (e.g., DC voltage) from the power supply DCS is applied to the electrode 52*a*, an electrostatic attractive force is generated between the electrostatic chuck 52 and the substrate W. By generating the electrostatic attractive force, the substrate W is attracted to and held on the electrostatic chuck 52.

As shown in FIG. 2, the electrostatic chuck 52 includes a central portion 52*c* and a peripheral portion 52*p*. The central portion 52*c* intersects with the axis AX. The substrate W is mounted on an upper surface of the central portion 52*c*. The peripheral portion 52*p* extends in a circumferential direction from the outer side of the central portion 52*c*. In one embodiment, a thickness of the peripheral portion 52*p* is thinner than that of the central portion 52*c*, and an upper surface of the peripheral portion 52*p* extends at a position lower than the upper surface of the central portion 52*c*. A focus ring FR is disposed on the peripheral portion 52*p* and the member 17 to surround the edge of the substrate W.

A plurality of heaters HT is provided in the electrostatic chuck 52. Each of the heaters HT may be a resistance heating element. In one example, the electrostatic chuck 52 has a plurality of concentric zones with the axis AX, and one or more heaters HT are provided in each of the concentric zones. The temperature of the substrate W mounted on the supporting table 14 is controlled by the heaters HT and/or the heat exchange medium supplied to the flow path 50*f*. In the supporting table 14, a gas line for supplying a heat transfer gas such as He gas to a gap between the substrate W and the electrostatic chuck 52 may be provided.

In one embodiment, a plurality of terminals 52*t* is provided on the bottom surface of the peripheral portion 52*p*. Each of the terminals 52*t* is electrically connected to a corresponding one of the heaters HT. Each of the terminals 52*t* and the heater corresponding thereto are connected through an internal wiring in the electrostatic chuck 52.

The power for driving the heaters HT is supplied from a heater controller HC (see FIG. 1). The heater controller HC includes a heater power supply and is configured to individually supply power (AC output) to the heaters HT. In order to supply the power from the heater controller HC to the heaters HT, the plasma processing apparatus 1 includes a plurality of power supply lines 70. Through the power supply lines 70, the power is supplied from the heater controller HC to the heaters HT. The plasma processing apparatus 1 further includes a filter device FD. The filter device FD is configured to prevent a high frequency power from flowing into the heater controller HC through the power supply lines 70. The filter device FD has a plurality of filters FT.

Figure 3:
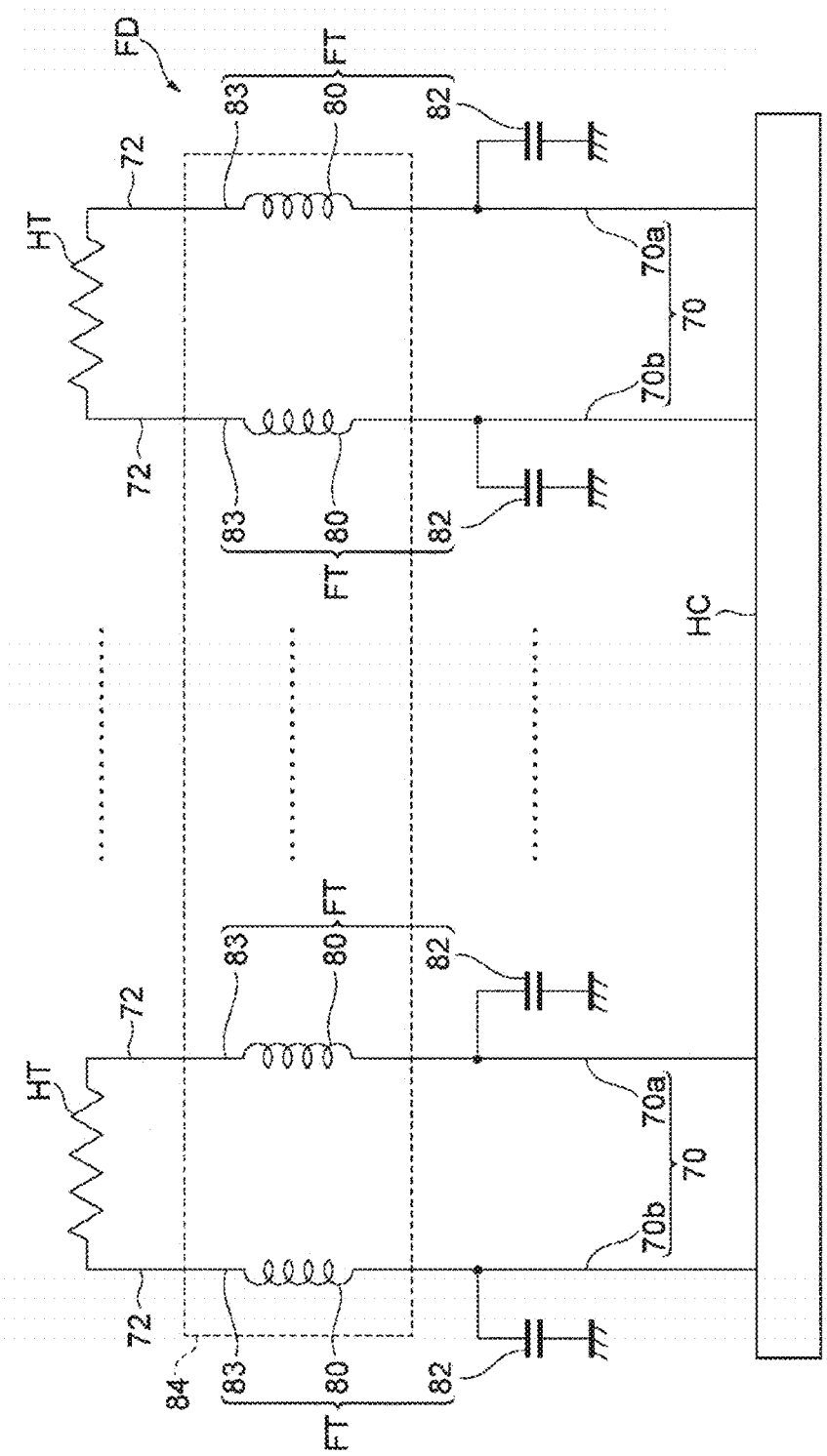
FIG. 3 shows a circuit configuration of a plurality of filters of the plasma processing apparatus shown in FIG. 1 together with a plurality of heaters and a heater controller.

FIG. 3 shows a circuit configuration of the filters of the plasma processing apparatus shown in FIG. 1 together with the heaters and the heater controller. Hereinafter, the description will be explained with reference to FIGS. 1 to 3. The heaters HT are connected to the heater controller HC through the power supply lines 70, respectively, as described above. The power supply lines 70 include a plurality of power supply line pairs. As shown in FIG. 3, each of the power supply line pairs includes a power supply line 70*a* and a power supply line 70*b*. Each of the heaters HT is electrically connected with the heater controller HC through one power supply line pair, i.e., the power supply line 70*a* and the power supply line 70*b*.

The filter device FD is provided outside the chamber 10. The filter device FD includes a plurality of coils 80, a plurality of capacitors 82, a plurality of wirings 83, and a housing 84. Each of the coils 80 has one end and the other end. Each of the wirings 83 is electrically connected to one end of each of the coils 80. Each of the wirings 83 electrically connects each of the coils 80 with a heater corresponding thereto among the heaters HT. The other end of each of the coils 80 is connected to the heater controller HC. One ends of the capacitors 82 are electrically connected to the other ends of the coils 80, respectively. The other end of each of the capacitors 82 is electrically connected to the ground.

The filter device FD includes a plurality of filters FT. Each of the filters FT includes one coil among the coils 80 and one capacitor connected the corresponding one coil among the capacitors 82. One coil among the coils 80 and a plurality of wirings connected to the corresponding one coil among the wirings 83 form a part of each of the power supply lines 70.

The coils 80 are accommodated in the housing 84. At least a part of each of the wirings 83 extends within the housing 84. In the examples of FIGS. 1 and 2, the wirings 83 are accommodated in the housing 84. As shown in FIGS. 1 and 2, the capacitors 82 are accommodated in the housing 84 to be positioned below the coils 80.

The housing 84 is a cylindrical container. The housing 84 is made of a conductor. The housing 84 is electrically grounded. The coil 80 of each filter FT and the housing 84 constitute a distributed constant line. In other words, each of the filters FT has impedance frequency characteristic including a plurality of resonance frequencies.

An upper end of the housing 84 may be fixed to the bottom portion of the chamber body 12. Therefore, the filter device FD may be provided directly below the chamber 10. In one embodiment, the housing 84 includes a main body 84a and a bottom lid 84b. The main body 84a has a cylindrical shape. The bottom lid 84b is attached to a lower end of the main body 84a to block an opening at the lower end of the main body 84a.

Figure 4:
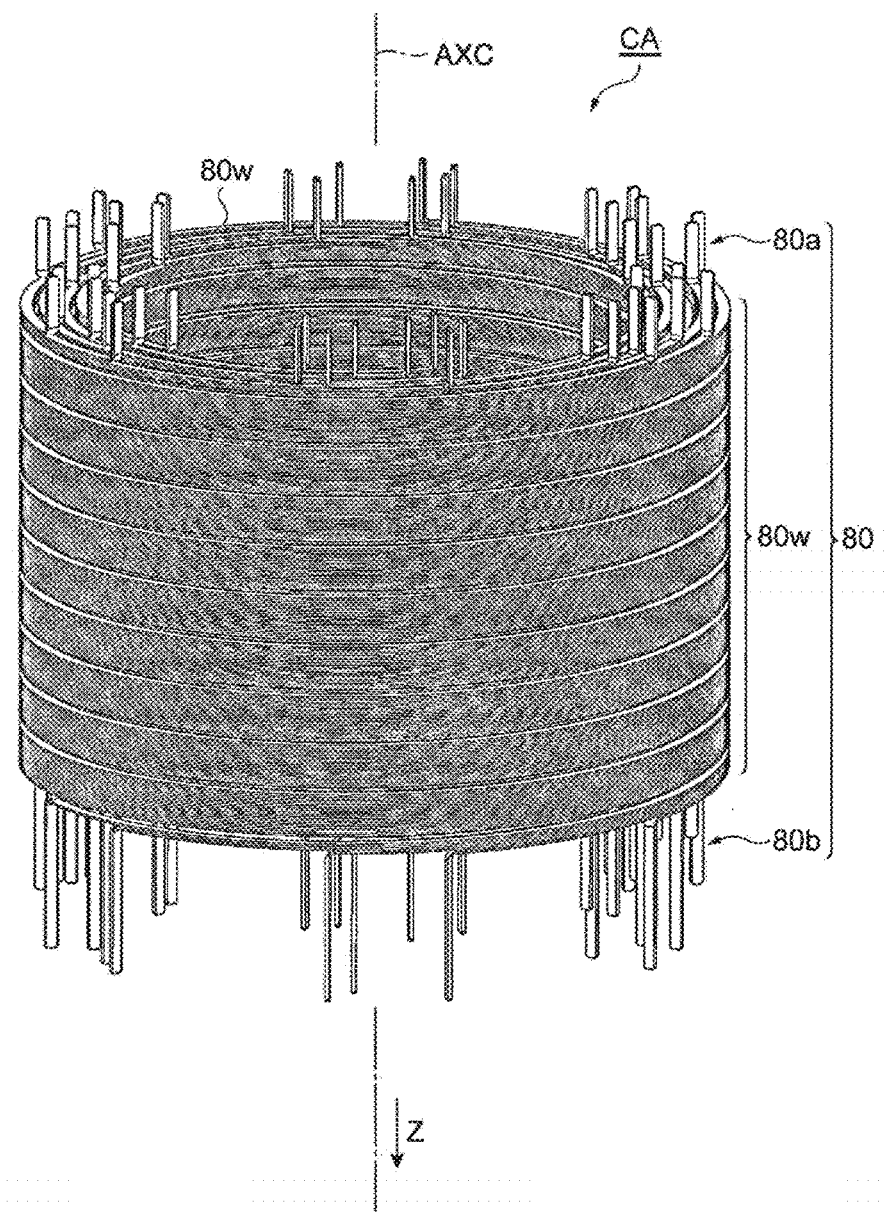
FIG. 4 is a perspective view of a plurality of coils of a filter device according to the embodiment.
Figure 5:
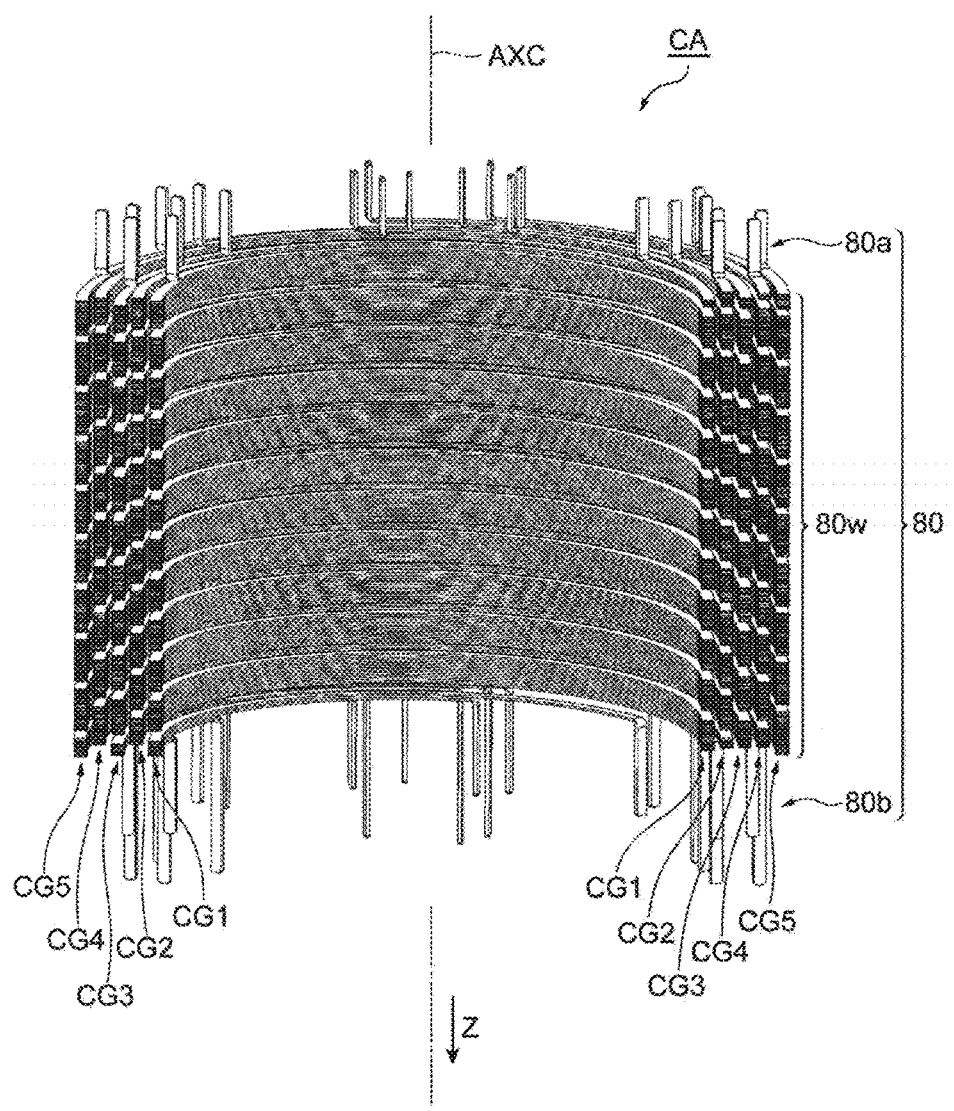
FIG. 5 is a partial perspective view of the coils shown in FIG. 4.
Figure 6:
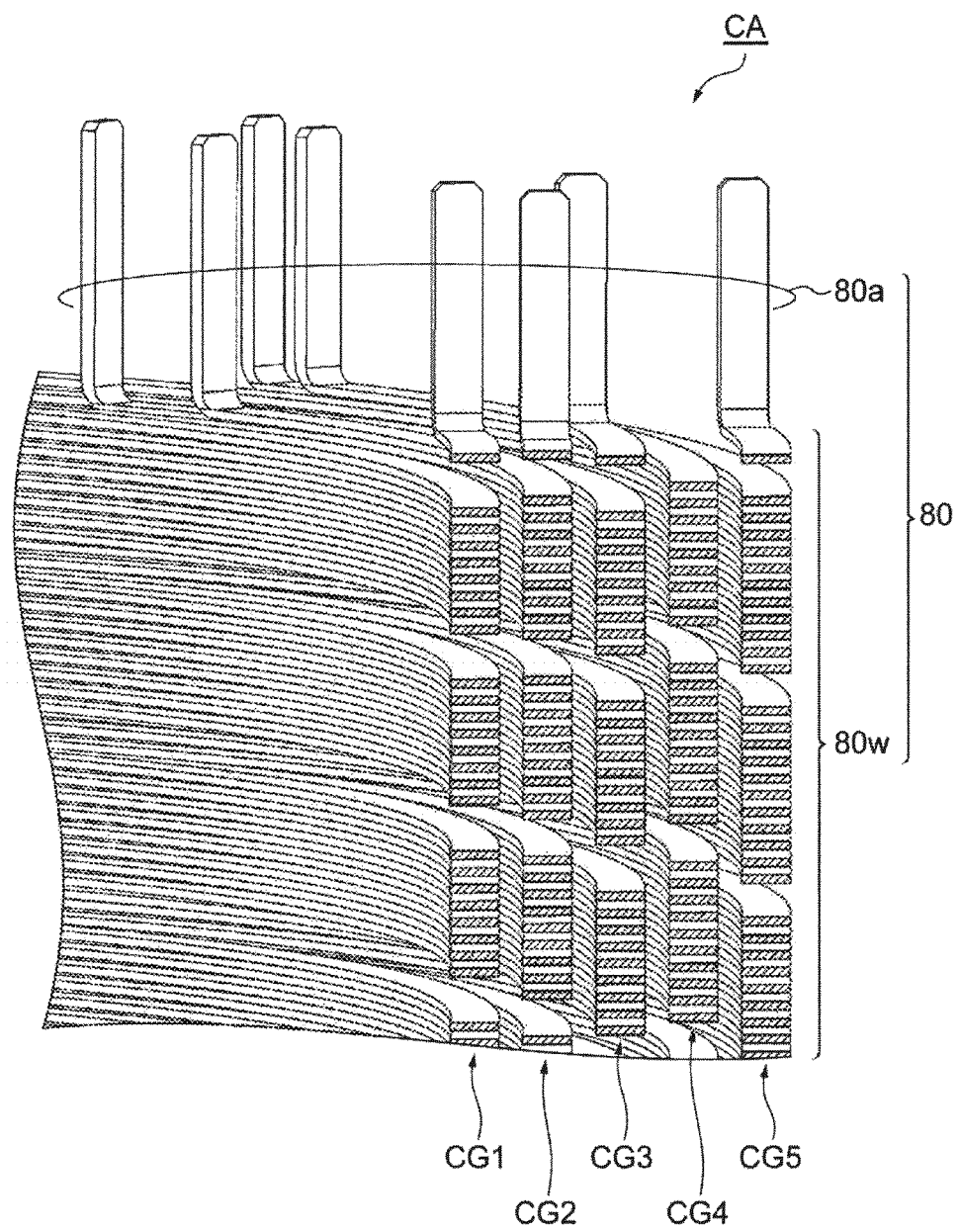
FIG. 6 is an enlarged perspective view showing a part of the coils shown in FIG. 4.

Hereinafter, the coils 80 will be described in detail. FIG. 4 is a perspective view of the coils of the filter device according to an embodiment. FIG. 5 is a partial perspective view of the coils shown in FIG. 4. FIG. 6 is an enlarged perspective view showing a part of the coils shown in FIG. 4. Each of the coils 80 may be an air-core coil. The coils 80 are arranged coaxially with a central axis AXC. The central axis AXC extends in a vertical direction. Each of the coils 80 has a conductor and a coating film covering the conductor. The coating film is made of an insulating material. The coating film may be made of a resin such as polyetheretherketone (PEEK) or polyamideimide. In one embodiment, the coating film of each coil 80 may have a thickness of 0.1 mm or less.

Each of the coils 80 has lead lines 80a and 80b, and a winding portion 80w. The winding portion 80w extends in a spiral shape around the central axis AXC and has a plurality of turns. The lead lines 80a and 80b extend along an axial direction Z of the central axis AXC. The lead line 80a extends from one end of the winding portion 80w, and the lead line 80b extends from the other end of the winding portion 80w. The other end of the winding portion 80w is the end of the winding portion 80w on the side of the capacitor 82 corresponding thereto.

Groups of the coils 80 constitute a coil assembly CA. The coil assembly CA includes a plurality of coil groups CG. In other words, the coils 80 constitute a plurality of coil groups CG. The number of the coil groups CG may be two or more. In the examples shown in FIGS. 4 to 6, the coil groups CG include coil groups CG1, CG2, CG3, CG4 and CG5. Each of the coil groups CG includes two or more coils 80. The number of the coils 80 included in each of the coil groups CG may be two or more. In the examples shown in FIGS. 4 to 6, the coil group CG1 includes eight coils 80, the coil group CG2 includes nine coils 80, the coil group CG3 includes nine coils 80, the coil group CG4 includes ten coils 80, and the coil group CG5 includes eleven coils 80.

In the two or more coils 80 of each of the coil groups CG, the respective winding portions 80w extend in a spiral shape around the central axis AXC and are arranged sequentially and repeatedly in the axial direction Z. In other words, the winding portions 80w of the two or more coils 80 of each of the coil groups CG are arranged in multiple layers along the axial direction Z and provided in a spiral shape around the central axis AXC. In one embodiment, in each of the coil groups CG, a distance of the axial gap between conductors of adjacent turns in the axial direction Z may be 0.2 mm or less.

The winding portions 80w of the two or more coils 80 of each coil group CG have the common central axis AXC and the same inner diameter and the same outer diameter. The winding portions 80w of the coils 80 have the same cross sectional shape, e.g., a flat rectangular cross sectional shape.

The coil groups CG are coaxially provided to have the common central axis AXC. In the examples shown in FIGS. 4 to 6, the coil groups CG1 to CG5 are arranged coaxially. Further, in the examples shown in FIGS. 4 to 6, the coil group CG1 is provided at the inner side of the coil group CG2, the coil group CG2 is provided at the inner side of the coil group CG3, the coil group CG3 is provided at the inner side of the coil group CG4, and the coil group CG4 is provided at the inner side of the coil group CG5.

The outer diameter of the winding portions 80w of one of the two adjacent coil groups in a radial direction relative to the central axis AXC is smaller than the inner diameter of the winding portions 80w of the other one of the two adjacent coil groups. In the examples shown in FIGS. 4 to 6, the outer diameter of the winding portions 80w of each of the two or more coils 80 included in the coil group CG1 is smaller than the inner diameter of the winding portions 80w of each of the two or more coils 80 included in the coil group CG2. The outer diameter of the winding portions 80w of each of the two or more coils 80 included in the coil group CG2 is smaller than the inner diameter of the winding portions 80w of each of the two or more coils 80 included in the coil group CG3. The outer diameter of the winding portions 80w of each of the two or more coils 80 included in the coil group CG3 is smaller than the inner diameter of the winding portions 80w of each of the two or more coils 80 included in the coil group CG4. The outer diameter of the winding portions 80w of each of the two or more coils 80 included in the coil group CG4 is smaller than the inner diameter of the winding portions 80w of each of the two or more coils 80 included in the coil group CG5.

A pitch between turns of each of the two or more coils 80 of a first coil group of the coil groups CG is greater than a pitch between turns of each of the two or more coils 80 of a second coil group disposed at an inner side of the first coil group. In the examples shown in FIGS. 4 to 6, a pitch between turns of each of the coils 80 of the coil group CG5 is greater than a pitch between turns of each of the coils 80 of the coil group CG4. A pitch between turns of each of the coils 80 of the coil group CG4 is greater than a pitch between turns of each of the coils 80 of the coil group CG3. A pitch between turns of each of the coils 80 of the coil group CG3 is greater than a pitch between turns of each of the coils 80 of the coil group CG2. A pitch between turns of each of the coils 80 of the coil group CG2 is greater than a pitch between turns of each of the coils 80 of the coil group CG1. In one embodiment, the pitch between turns of each of the coils 80 is set such that inductances of the coils 80 become substantially the same.

When a plurality of coils is simply arranged in parallel, the impedances of the filters are decreased. However, with the configuration of the filter device FD in the present embodiment, the decrease in the impedance is suppressed by the coupling between the coils 80. In addition, an inductance difference between the coils 80 is decreased because the pitch between the turns of each of the two or more coils of the outer coil group is greater than the pitch between the turns of each of the two or more coils of the inner coil group. Therefore, the difference in frequency characteristic of the impedance of the filters FT is reduced.

In one embodiment, the coils 80 have substantially the same coil length. The coil length indicates a length in the axial direction Z between one end and the other end of the winding portion 80w of each of the coils 80. In one embodiment, a difference in length between the coil having the maximum coil length and the coil having the minimum coil length among the coils 80 is 3% or less of the minimum coil length. In accordance with these embodiments, the difference in the frequency characteristics of the impedance of the filters FT is further reduced.

In one embodiment, the lead lines 80a of the two or more coils 80 of each of the coil groups CG are provided at equal intervals in the circumferential direction about the central axis AXC. In accordance with the embodiment, the difference in the frequency characteristics of the impedances of the filters FT is further reduced.

In one embodiment, a distance in the radial direction of the coil groups CG, i.e., a distance of a radial gap between any two adjacent coil groups in the radial direction about the central axis AXC, is 1.5 mm or less. In the present embodiment, the difference in the frequency characteristics of the impedances of the filters FT is further reduced.

In one embodiment, an inner diameter of the two or more coils 80 of the outermost coil group among the coil groups CG is 1.83 times or less than an inner diameter of the two or more coils of the innermost coil group among the coil groups CG. In the examples shown in FIG. 4 to 6, the inner diameter of each of the coils 80 of the coil group CG5 is 1.83 times or less than the inner diameter of each of the coils 80 of the coil group CG1. In accordance with the present embodiment, the difference in the frequency characteristics of the impedances of the plurality of filters FT is further reduced.

As described above, the filter device FD having the coils 80 is provided outside the chamber 10. In one embodiment, the coil groups CG are arranged coaxially with the central axis AXC to surround the conductor pipe 66 at a position directly below the chamber 10. In a state where the coil groups CG are arranged at the position directly below the chamber 10, the central axis AXC coincides with the axis AX.

Figure 7:
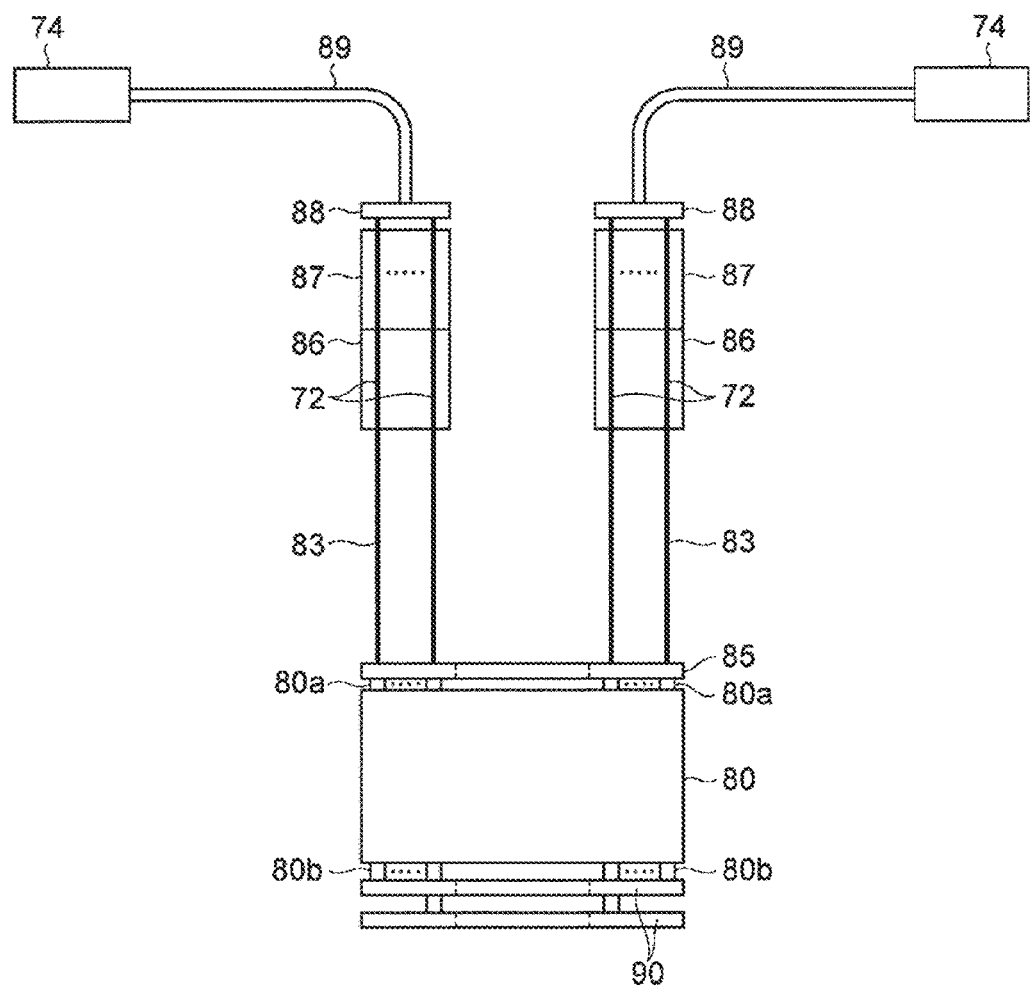
FIG. 7 schematically shows an electrical configuration for electrically connecting the coils of the filter device to a plurality of terminals of an electrostatic chuck in the plasma processing apparatus shown in FIG. 1.
Figure 8:
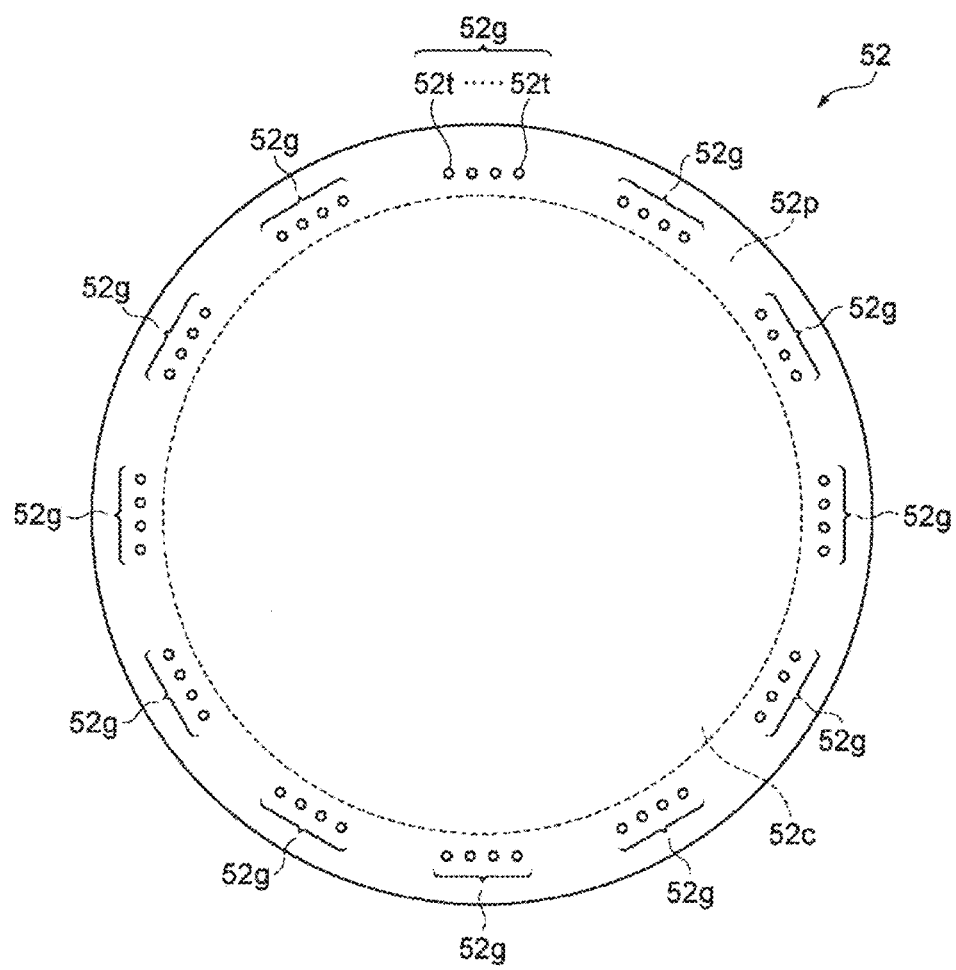
FIG. 8 is a plan view of a bottom surface of the electrostatic chuck of the plasma processing apparatus shown in FIG. 1.
Figure 9:
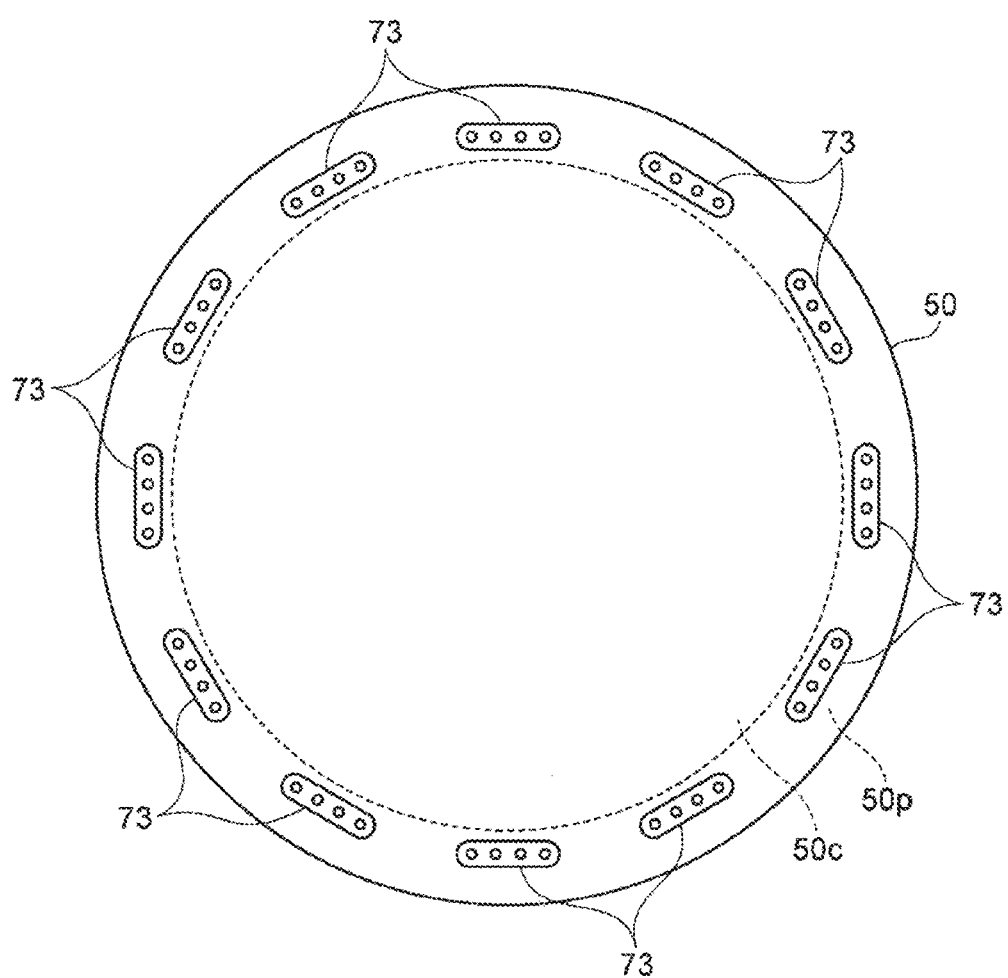
FIG. 9 is a plan view of a bottom surface of a lower electrode of the plasma processing apparatus shown in FIG. 1.
Figure 10:
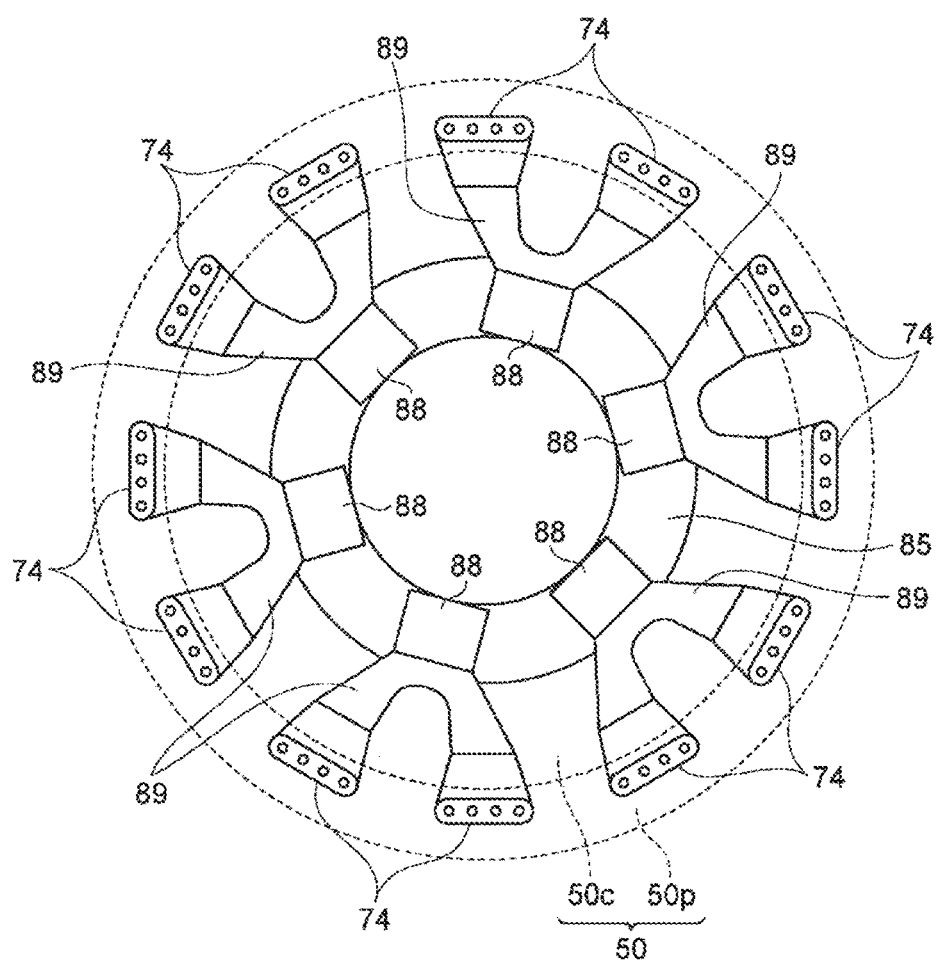
FIG. 10 is a plan view showing a plurality of members for electrically connecting the coils of the filter device to the terminals of the electrostatic chuck in the plasma processing apparatus shown in FIG. 1.

As shown in FIG. 3, the plasma processing apparatus 1 further includes a plurality of wirings 72. Each of the wirings 72 forms a part of each of the power supply lines 70. The wirings 72 are electrically connected to the wirings 83, respectively. In other words, the wirings 83 electrically connect the coils 80 provided outside the chamber 10 with the terminals 52t of the electrostatic chuck 52 through the wirings 72. Hereinafter, the wirings 72 will be described in detail with reference to FIGS. 7 to 10 together with FIGS. 1 and 2. FIG. 7 schematically shows an electrical configuration for electrically connecting the coils of the filter device to the terminals of the electrostatic chuck in the plasma processing apparatus shown in FIG. 1. FIG. 8 is a plan view of the bottom surface of the electrostatic chuck of the plasma processing apparatus shown in FIG. 1. FIG. 9 is a plan view of the bottom surface of the lower electrode of the plasma processing apparatus shown in FIG. 1. FIG. 10 is a plan view showing a plurality of members for electrically connecting the coils of the filter device to the terminals of the electrostatic chuck in the plasma processing apparatus shown in FIG. 1.

As shown in FIG. 8, in one embodiment, the terminals 52t are arranged at the peripheral portion 52p of the electrostatic chuck 52. The terminals 52t are arranged along the bottom surface of the peripheral portion 52p. The terminals 52t constitute a plurality of terminal groups 52g. Each of the terminal groups 52g includes several terminals 52t. The terminal groups 52g are arranged at equal intervals in the entire circumference of the peripheral portion 52p. In one example, as shown in FIG. 8, the terminals 52t constitute twelve terminal groups 52g. Each of the twelve terminal groups 52g includes four terminals 52t.

As shown in FIG. 9, the lower electrode 50 has a central portion 50c and a peripheral portion 50p. The central portion 52c of the electrostatic chuck 52 is provided on the central portion 50c of the lower electrode 50. The peripheral portion 52p of the electrostatic chuck 52 is provided on the peripheral portion 50p of the lower electrode 50. Multiple through-holes are formed in the peripheral portion 50p of the lower electrode 50. The upper ends of the through-holes of the peripheral portion 50p are arranged to face regions in the peripheral portion 52p in which the terminal groups 52g are provided. Multiple electrical connectors 73 are provided in the through-holes of the peripheral portion 50p. The number of terminals included in each of the electrical connectors 73 is equal to the number of the terminals 52t included in a corresponding one of the terminal groups 52g. The terminals of the electrical connectors 73 are connected to the terminals 52t, respectively.

As shown in FIG. 2, multiple electrical connectors 74 are provided in the conductive member 54 to be positioned directly below the electrical connectors 73. The electrical connectors 74 are connected to the electrical connectors 73 corresponding thereto. Each of the electrical connectors 74 has the same number of terminals as the corresponding one of the electrical connectors 73. The terminals of the electrical connectors 74 are connected to the terminals 52t through the terminals of the electrical connectors 73, respectively.

As shown in FIGS. 2 and 7, the lead lines 80a of the coils 80 are connected to a circuit board 85. The circuit board 85 is disposed above the coils 80. The circuit board 85 is disposed in the housing 84. The circuit board 85 has an annular plate shape to extend about the axis AX. Multiple wirings are formed on the circuit board 85. The wirings of the circuit board 85 are connected to the lead lines 80a of the coils 80, respectively. The wirings 83 are connected to the wirings of the circuit board 85, respectively.

The wirings 83 are connected to multiple first electrical connectors 86. The first electrical connectors are disposed above the circuit board 85. The first electrical connectors 86 extend from the housing 84 to positions above the bottom portion of the chamber body 12. The first electrical connectors 86 are arranged at equal intervals around the axis AX. In one example, the number of the first electrical connectors 86 is six. Each of the first electrical connectors 86 has several terminals. The wirings 83 are connected to the terminals of the first electrical connectors 86, respectively. Each of the terminals of the first electrical connectors 86 forms a part of a corresponding one of the wirings 72.

Multiple second electrical connectors 87 are provided directly above the first electrical connectors 86. In one example, the number of the second electrical connectors 87 is six. The second electrical connectors 87 are connected to the corresponding one of the first electrical connectors 86. The terminals of the second electrical connectors 87 are connected to the terminals of the first electrical connectors 86, respectively. In other words, each of the terminals of the second electrical connectors 87 forms a part of a corresponding one of the wirings 72.

The second electrical connectors 87 are supported by a plurality of circuit boards 88, respectively. The circuit boards 88 are provided above the respective second electrical connectors 87.

Multiple flexible circuit boards 89 extend from the second electrical connectors 87 to positions below the peripheral portion 52p of the electrostatic chuck 52. Each of the flexible circuit boards 89 is, e.g., a flexible printed circuit board.

Each of the flexible circuit boards has one or more electrical connectors 74 among the electrical connectors 74. In one example, each of the flexible circuit boards 89 has two electrical connectors 74. Each of the flexible circuit boards 89 provides several wirings. The wirings provided by each of the flexible circuit boards 89 connect the terminals of the second electrical connectors 87 to the terminals of the electrical connectors 74. In other words, each of the wirings provided by the flexible circuit boards 89 forms a part of a corresponding one of the wirings 72.

As described above, each of the wirings 72 extends in the corresponding one of the first electrical connectors 86, the corresponding one of the second electrical connectors 87, and the corresponding one of the flexible circuit boards 89. The wirings 72 have substantially the same length.

Referring back to FIG. 2, the plasma processing apparatus 1 further includes a plurality of additional circuit boards 90. The additional circuit boards 90 are provided in the housing 84 to be positioned below the coils 80. The additional circuit boards 90 are arranged along the axial direction Z. Each of the capacitors 82 is provided on any one of the circuit boards 90. The capacitors 82 are mounted on the upper and the lower surfaces of the circuit boards 90. A wiring pattern for connecting the coil 80 and the capacitor 82 corresponding to each other is formed on each of the circuit boards 90. By using the circuit boards 90, a large number of capacitors 82 can be supported in the housing 84.

In the plasma processing apparatus 1 described above, a plurality of coil groups CG, each including two or more coils 80, are arranged coaxially to have the common central axis AXC and, thus, the space occupied by the coils 80 constituting the coil groups CG is small. In addition, the coil groups CG are arranged to surround the conductor pipe 66 and, thus, the cross-sectional area of each coil 80 is large. Accordingly, a required inductance can be obtained even if the coil length of each coil 80 is short.

In one embodiment, each of the wirings 72 extends in the corresponding one of the first electrical connectors 86, the corresponding one of the second electrical connectors 87, and the corresponding one of the flexible circuit boards 89. In the present embodiment, it is possible to extend the wirings 72 in the flexible circuit boards 89 such that the lengths of the wirings 72 become substantially the same. In other words, it is possible to set the lengths of the wirings 72 to be substantially the same by the layout of the wiring patterns in the flexible circuit boards 89.

Figure 11:
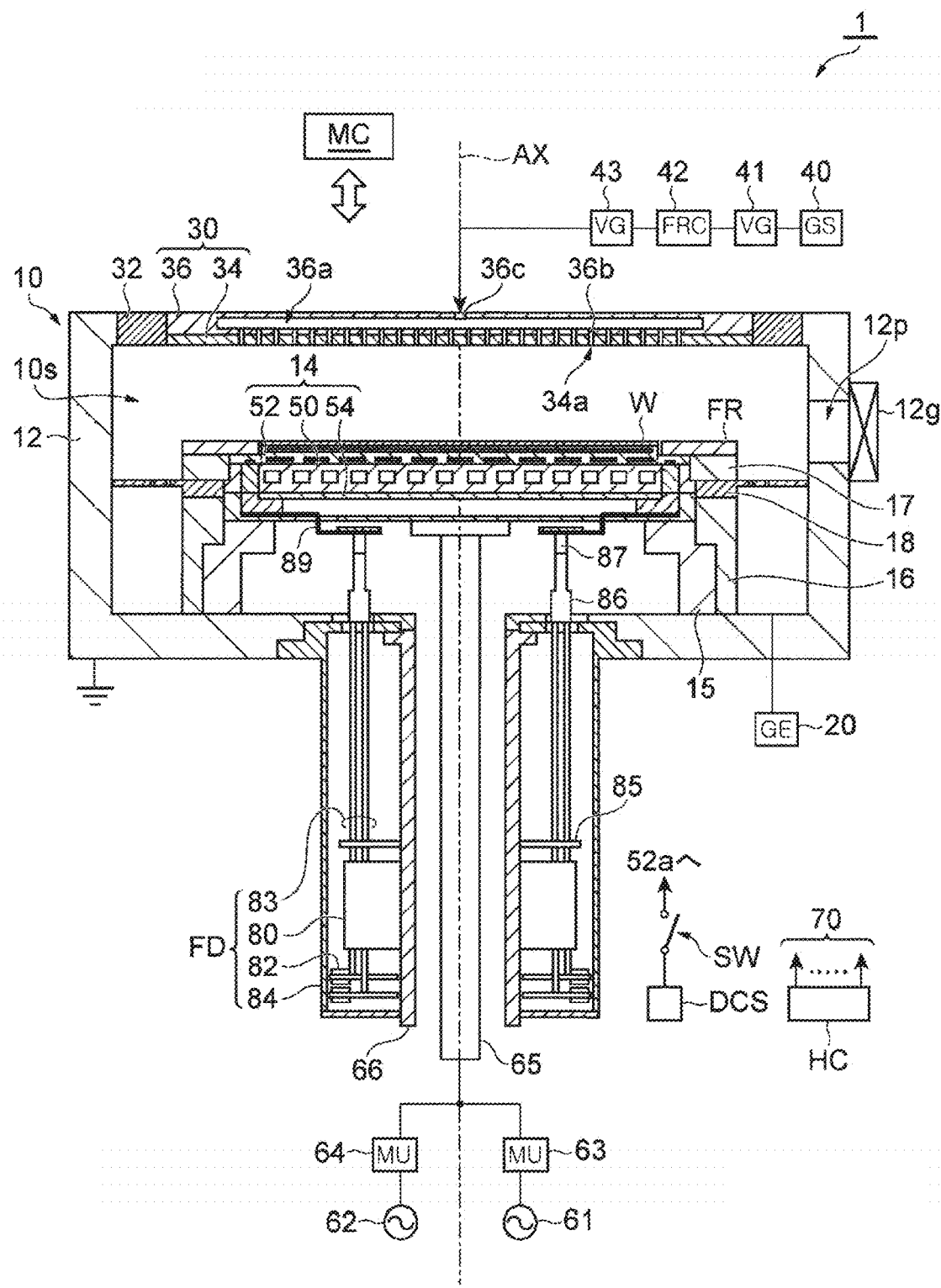
FIG. 11 schematically shows the plasma processing apparatus according to the embodiment.
Figure 12:
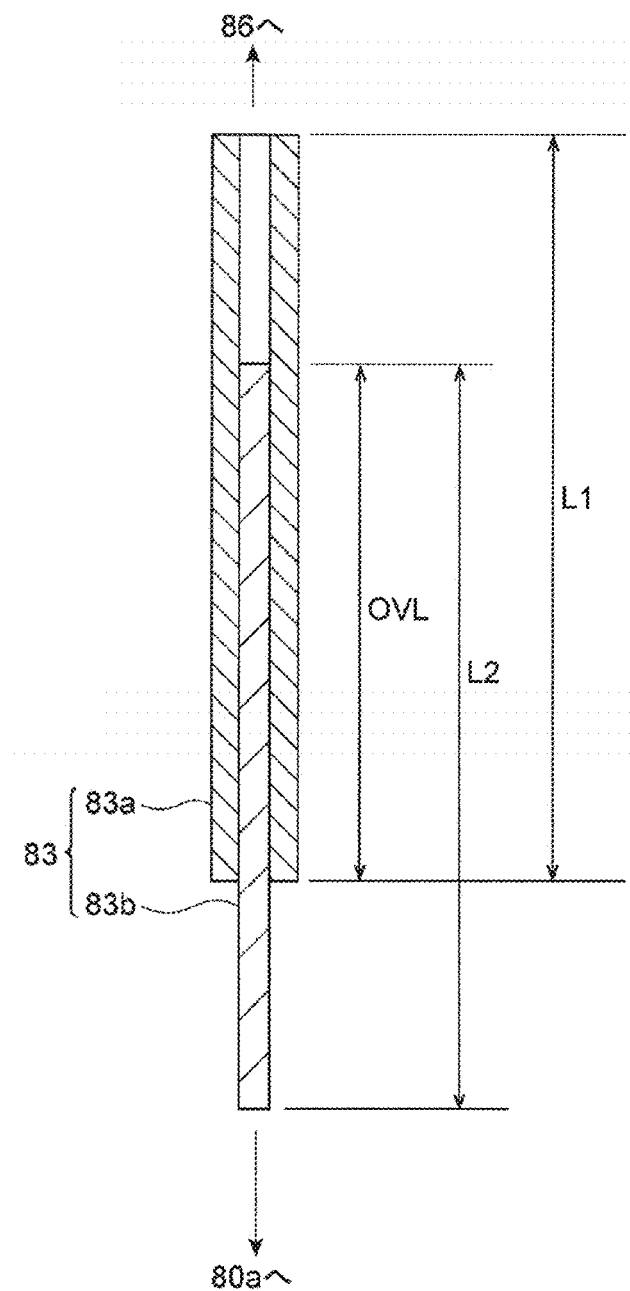
FIG. 12 is a cross sectional view showing a wiring of the filter device according to one embodiment.

Hereinafter, the description will be explained with reference to FIGS. 11 and 12 together with FIGS. 1 and 2. FIG. 11 schematically shows the plasma processing apparatus according to one embodiment. FIG. 11 shows the plasma processing apparatus 1 in which the wirings 83 are extended from the state shown in FIG. 1. FIG. 12 is a cross-sectional view of the wiring of the filter device according to one embodiment.

As shown in FIG. 1 and FIG. 11, the wirings 83 are configured to vary their lengths in the housing 84. In one embodiment, each of the wirings 83 has a first portion 83a and a second portion 83b. The first portion 83a extends in the vertical direction (i.e., along the axial direction Z). One end (upper end) of the first portion 83a is electrically connected to a corresponding one of the heaters HT. In one embodiment, one end of the first portion 83a is electrically connected to a terminal of a corresponding one of the first electrical connectors 86.

The second portion 83b is electrically connected to one end (lead line 80a) of a corresponding one of the coils 80. In one embodiment, the second portion 83b extends in the vertical direction. The second portion 83b is slidably in contact with the first portion 83a so that an overlap length OVL between the first portion 83a and the second portion 83b can be varied. The length of each of the wirings 83 in the housing 84 is indicated by 'L1+L2−OVL'. L1 indicates the length of the first portion 83a and L2 indicates the length of the second portion 83b. Therefore, the length of each of the wirings 83 can be adjusted by adjusting the overlap length OVL.

In one embodiment, as shown in FIG. 12, the first portion 83a is formed in a cylindrical shape. The second portion 83b can be inserted into the first portion 83a. The second portion 83b is formed in, e.g., a rod shape. In the present embodiment, the overlap length OVL is an insertion length of the second portion 83b inserted into the first portion 83a. In other words, the length of each of the wirings 83 can be adjusted by adjusting the insertion length of the second portion 83b inserted into the first portion 83a.

In each filter FT of the filter device FD, as the length of the wiring 83 connected to the coil 80 in the housing 84 is increased, a higher-order peak frequency in the frequency characteristic of the impedance is shifted to a lower frequency side. This is because the electrostatic capacity between the wiring 83 and the housing 84 and the inductance of the wiring 83 are changed as the length of the wiring 83 in the housing 84 is changed. In the filter device FD, the lengths of the wirings 83 in the housing 84 are individually adjustable (changeable) and, thus, the higher-order peak frequency of each of the wirings 83 can be adjusted by adjusting the lengths of the wirings 83 individually in the housing 84. With this configuration of the filter device FD, it is possible to adjust the impedance at the desired frequency for each of the filters FT by adjusting the higher-order peak frequency of each of the filters FT.

While various embodiments have been described above, various modifications can be made without being limited to the above-described embodiments. For example, the plasma processing apparatus may be a plasma processing apparatus having any plasma source, such as an inductively coupled plasma processing apparatus, a plasma processing apparatus that generates plasma by using surface waves such as microwaves, or the like.

The lengths of the wirings 83 in the housing 84 may be changed collectively. Alternatively, the lengths of the wirings 83 connected to the coils 80 of each of the coil groups CG may be changed collectively, and further the lengths of the wirings 83 connected to the coils 80 of one of the coil groups CG may be changed collectively, independent of the coils 80 of another one of the coil groups CG. The wirings 83 may extend toward the central axis AXC to come together at a region near the central axis AXC and may extend upward from the region.

The shapes of the first portion 83a and the second portion 83b are not limited. For example, the first portion 83a may be formed in a rod shape and the second portion 83b may be formed in a cylindrical shape.

Hereinafter, a first simulation to a fourth simulation that have been conducted to evaluate the filter device FD will be described. In the first simulation to the fourth simulation, the lengths of the wirings 83 in the housing 84 were set to be different from one another and the combined impedance of the filters FT was obtained. Specifically, the first simulation to the fourth simulation were carried out by setting the lengths of the wirings 83 in the housing 84 to 0 mm, 200 mm, 400 mm, and 600 mm, respectively. The following is description on other settings for the first simulation to the fourth simulation.

Figure 13A:
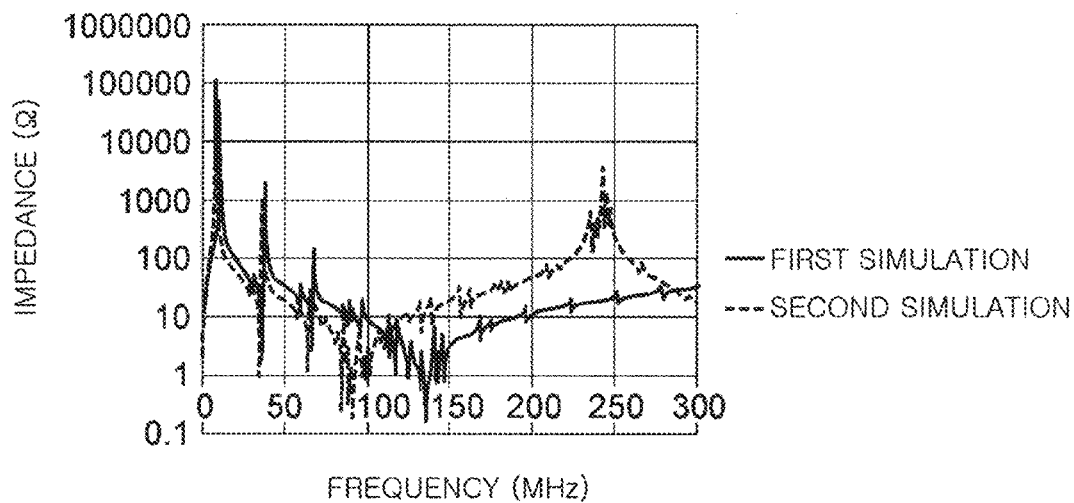
FIG. 13A is a graph showing frequency characteristics of an impedance obtained in a first simulation and a second simulation.
Figure 13B:
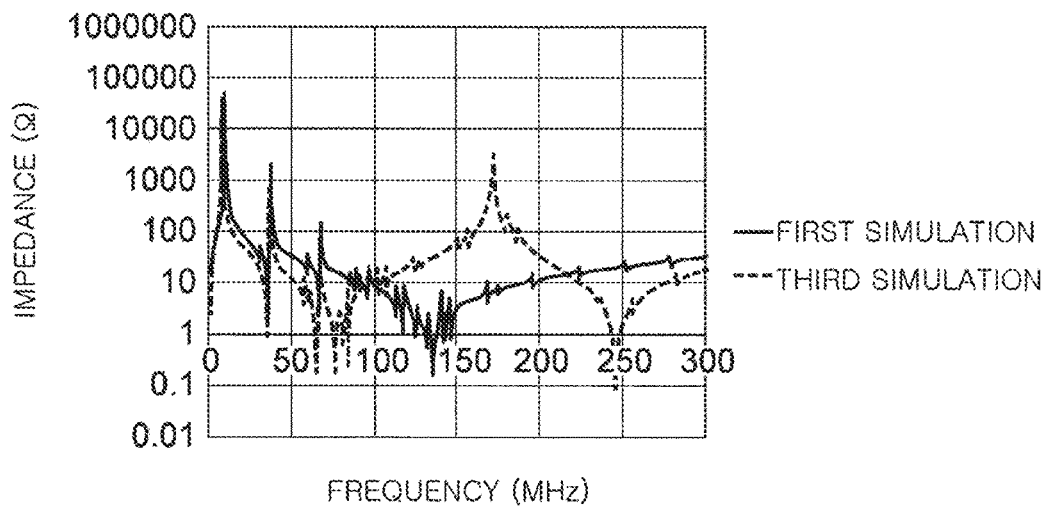
FIG. 13B is a graph showing frequency characteristics of an impedance obtained in the first simulation and a third simulation.
Figure 13C:
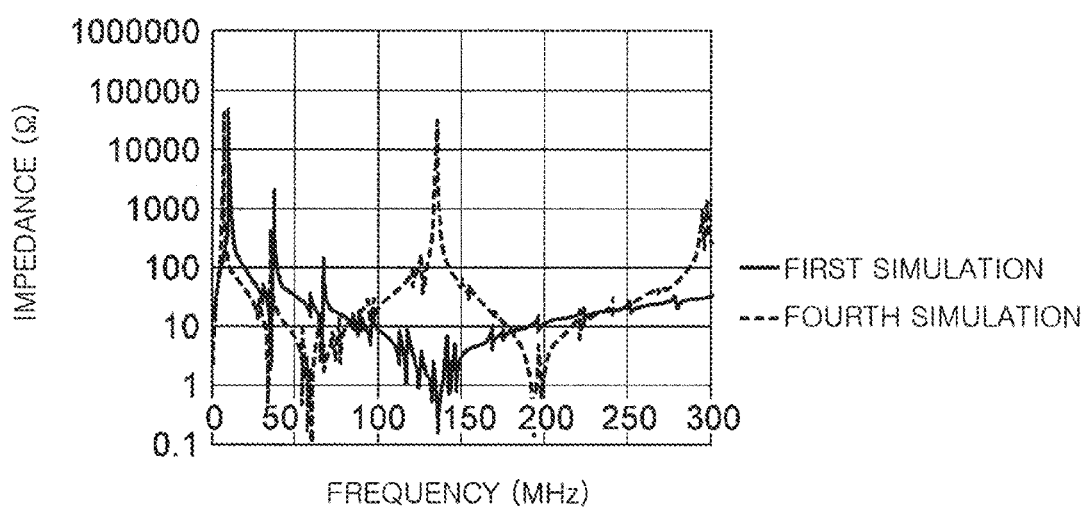
FIG. 13C is a graph showing frequency characteristics of an impedance obtained in the first simulation and a fourth simulation.

<Other Settings for First to Fourth Simulations>
 1. Setting of the coil group CG1
 The number of coils: 8
 Shape of each coil: 3 mm×0.8 mm flat rectangle
 Inner diameter of each coil: 131 mm
 The number of turns of each coil: 11.33
 Pitch between turns of each coil: 10.2 mm
 Coil length of each coil: 115.5 mm
 Distance between turns of adjacent coils: 2.2 mm
 Electrostatic capacitance of capacitor connected to each coil of coil group CG1: 2700 pF
 2. Setting of the coil group CG2
 The number of coils: 9
 Shape of each coil: 3 mm×0.8 mm flat rectangle
 Inner diameter of each coil: 140 mm
 The number of turns of each coil: 10.66
 Pitch between turns of each coil: 10.7 mm
 Coil length of each coil: 114.1 mm
 Distance between turns of adjacent coils: 1.7 mm
 Electrostatic capacitance of capacitor connected to each coil of coil group CG2: 2700 pF
 3. Setting of the coil group CG3
 The number of coils: 9
 Shape of each coil: 3 mm×0.8 mm flat rectangle
 Inner diameter of each coil: 149 mm
 The number of turns of each coil: 10.16
 Pitch between turns of each coil: 11.3 mm
 Coil length of each coil: 114.8 mm
 Distance between turns of adjacent coils: 2.3 mm
 Electrostatic capacitance of capacitor connected to each coil of coil group CG3: 2700 pF
 4. Setting of the coil group CG4
 The number of coils: 10
 Shape of each coil: 3 mm×0.8 mm flat rectangle
 Inner diameter of each coil: 158 mm
 The number of turns of each coil: 9.66
 Pitch between turns of each coil: 11.8 mm
 Coil length of each coil: 113.9 mm
 Distance between turns of adjacent coils: 1.8 mm
 Electrostatic capacitance of capacitor connected to each coil of coil group CG4: 2700 pF
 5. Setting of the coil group CG5
 The number of coils: 11
 Shape of each coil: 3 mm×0.8 mm flat rectangle
 Inner diameter of each coil: 167 mm
 The number of turns of each coil: 9.33
 Pitch between turns of each coil: 12.5 mm
 Coil length of each coil: 116.6 mm
 Distance between turns of adjacent coils: 1.5 mm
 Electrostatic capacitance of capacitor connected to each coil of coil group CG5: 2700 pF FIG. 13A is a graph showing the frequency characteristic of the impedance obtained in the first simulation and the second simulation. FIG. 13B is a graph showing the frequency characteristic of the impedance obtained in the first simulation and the third simulation. FIG. 13C is a graph showing the frequency characteristic of the impedance obtained in the first simulation and the fourth simulation. In FIGS. 13A to 13C, the horizontal axis represents the frequency and the vertical axis represents the combined impedance of the filters FT. As can be seen from FIG. 13A to 13C, as the lengths of the wirings 83 in the housing 84 are increased, the higher-order peak frequency is shifted to the lower frequency side. Therefore, the impedance at the desired frequency of each filter FT can be adjusted by adjusting the lengths of the wirings 83 in the housing 84.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A filter device comprising:
a plurality of coils arranged coaxially;
a plurality of wirings, each of which is electrically connected to one end of each of the coils of the plurality of coils;
a plurality of capacitors, each of which is connected between the other end of each of the coils of the plurality of coils and the ground; and
a housing electrically grounded and configured to accommodate therein the plurality of coils,
wherein each of the wirings at least partially extends into the housing and has a length that is adjustable in the housing,
wherein the plurality of coils form a plurality of coil groups, each of the coil groups including two or more coils;
in each of the coil groups, the two or more coils are arranged such that winding portions of the two or more coils extend in a spiral shape around a central axis and turns of each of the winding portions are arranged sequentially and repeatedly in an axial direction in which the central axis extends;
the coil groups are arranged coaxially with the central axis, and
wherein the plurality of the coil groups are arranged sequentially in a radial direction relative to the central axis;
a pitch between the turns of each of the winding portions of a first coil group of the plurality of coil groups is greater than a pitch between the turns of each of the winding portions of a second coil group of the plurality of coil groups; and
the second coil group of the plurality of coil groups is provided at an inner side of the first coil group of the plurality of coil groups.

2. The filter device of claim 1, wherein each of the wirings includes:
a first portion; and
a second portion electrically connected to one end of a corresponding one of the plurality of coils,
wherein the second portion is slidably in contact with the first portion such that an overlap length between the first portion and the second portion is adjustable.

3. The filter device of claim 2, wherein the first portion is formed in a cylindrical shape,
the second portion is insertable into the first portion, and
the overlap length is an insertion length of the second portion inserted into the first portion.

4. The filter device of claim 1, wherein each of the wirings is configured to be inserted into the housing by an amount which is adjustable to change at least one of an electrostatic capacity between one of the wirings and the housing or an inductance of one of the wirings.

5. The filter device of claim 1, wherein each of the wirings includes:
a first portion;

a second portion connected to one end of a corresponding one of the plurality of coils;

an overlap length between the first portion and the second portion at which the first portion and the second portion overlap, and wherein the second portion is configured to be slidable with respect to the first portion to vary a length of the overlap length.

6. A plasma processing apparatus comprising:

a chamber;

a supporting table configured to support a substrate in an inner space of the chamber, the supporting table including a lower electrode and an electrostatic chuck provided on the lower electrode and having therein a plurality of heaters;

a power feeding unit electrically connected to the lower electrode and extending downward from the lower electrode;

a conductor pipe that is grounded and extends to surround the power feeding unit outside the chamber;

a high frequency power source electrically connected to the power feeding unit; and the filter device of claim 1 that is configured to prevent a high frequency power from flowing into a heater controller from the heaters, wherein each of the wirings of the filter device connects each of the coils of the plurality of coils with each of the heaters.

7. The plasma processing apparatus of claim 6, wherein each of the wirings includes:

a first portion; and a second portion electrically connected to one end of a corresponding one of the plurality of coils, wherein the second portion is slidably in contact with the first portion such that an overlap length between the first portion and the second portion is adjustable.

8. The plasma processing apparatus of claim 7, wherein the first portion is formed in a cylindrical shape, the second portion is insertable into the first portion, and the overlap length is an insertion length of the second portion inserted into the first portion.

* * * * *